(12) United States Patent
Kitamori et al.

(10) Patent No.: US 10,207,264 B2
(45) Date of Patent: Feb. 19, 2019

(54) FUNCTIONAL DEVICE AND METHOD OF MANUFACTURING THE SAME

(71) Applicant: Japan Science and Technology Agency, Kawaguchi-shi, Saitama (JP)

(72) Inventors: Takehiko Kitamori, Tokyo (JP); Kazuma Mawatari, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 0 days.

(21) Appl. No.: 14/432,068

(22) PCT Filed: Sep. 27, 2013

(86) PCT No.: PCT/JP2013/076271
§ 371 (c)(1),
(2) Date: Mar. 27, 2015

(87) PCT Pub. No.: WO2014/051054
PCT Pub. Date: Apr. 3, 2014

(65) Prior Publication Data
US 2015/0290641 A1  Oct. 15, 2015

(30) Foreign Application Priority Data
Sep. 28, 2012 (JP) .................. 2012-216267

(51) Int. Cl.
*B01L 3/00* (2006.01)
*B81C 1/00* (2006.01)
(Continued)

(52) U.S. Cl.
CPC ...... *B01L 3/502707* (2013.01); *B29C 65/002* (2013.01); *B81C 1/00119* (2013.01);
(Continued)

(58) Field of Classification Search
None
See application file for complete search history.

(56) References Cited

U.S. PATENT DOCUMENTS 5,427,638 A  6/1995 Goetz
6,210,894 B1 * 4/2001 Brennan .............. B01J 19/0046
435/6.11
(Continued)

FOREIGN PATENT DOCUMENTS

CN  101158447 A  4/2008
CN  101544348 A  9/2009
(Continued)

OTHER PUBLICATIONS

Wang et al "Water vapor containing plasma activation for rooom-temperature bonding" IEEE, May 22, 2012, p. 157.*
(Continued)

*Primary Examiner* — Betty J Forman
(74) *Attorney, Agent, or Firm* — Amster, Rothstein & Ebenstein LLP (57) ABSTRACT

A functional device (and a functional device manufacturing method) includes a first substrate in which a groove is formed in one surface, a second substrate which is integrally disposed by bonding one surface of the second substrate to the one surface of the first substrate, and forms a flow path together with the groove of the first substrate, at least one modification object of a capture body which captures a target substance supplied into the flow path, an electrode which imparts an electrical or a chemical action to the target substance, and a catalyst, in which the modification object is disposed by being modified on a part of an inner surface of the flow path, a bonding portion between the one surface of the first substrate and the one surface of the second substrate is formed by bonding fluorine to silica.

11 Claims, 7 Drawing Sheets

(51) Int. Cl.
*B29C 65/00* (2006.01)
*B29L 31/00* (2006.01)

(52) U.S. Cl.
CPC ... *B01L 2200/0689* (2013.01); *B01L 2200/12* (2013.01); *B01L 2300/0645* (2013.01); *B01L 2300/0816* (2013.01); *B01L 2300/0896* (2013.01); *B01L 2300/12* (2013.01); *B01L 2300/161* (2013.01); *B01L 2400/0415* (2013.01); *B29L 2031/7562* (2013.01); *B81B 2201/058* (2013.01)

(56) References Cited

U.S. PATENT DOCUMENTS

| | | | |
|---|---|---|---|
| 6,221,197 B1* | 4/2001 | Mori | C03C 27/04 118/723 ER |
| 7,579,136 B2 | 8/2009 | Shim et al. | |
| 2006/0257627 A1 | 11/2006 | Shim et al. | |
| 2008/0187757 A1* | 8/2008 | Tong | B81C 1/00357 428/411.1 |
| 2011/0100840 A1 | 5/2011 | Nakanishi et al. | |
| 2011/0177530 A1* | 7/2011 | Corcoran | G01N 33/558 435/7.92 |
| 2012/0224999 A1 | 9/2012 | Kaneko et al. | |

FOREIGN PATENT DOCUMENTS

| | | |
|---|---|---|
| EP | 1 950 569 A1 | 7/2008 |
| JP | H06-177017 A | 6/1994 |
| JP | 2003-516129 A | 5/2003 |
| JP | 2005-066382 A | 3/2005 |
| JP | 2006-212473 A | 8/2006 |
| JP | 2007-075950 A | 3/2007 |
| JP | 2011-000557 A | 1/2011 |
| KR | 10-2011-0055904 A | 5/2011 |
| WO | 01/32930 A1 | 5/2001 |
| WO | 2009/028093 A1 | 3/2009 |

OTHER PUBLICATIONS

Cheng et al "Bonding characteristics of 3C-Si-C wafers with hydrofluoric acid for high-temperature MEMS applications" Sensors and Actuators A, 2005 119: 599-604.*
Wang et al "Water vapor containing Plasma activation for room-temperature bonding" IEEE, May 22, 2012. p. 157.*
State Intellectual Property Office of People's Republic of China, Office Action, issued in CN Patent Application No. 201380050059. 5, which is Chinese counterpart of U.S. Appl. No. 14/432,068 dated Oct. 10, 2015, 9 pages (4 pages of English Translation, 5 pages of Office Action).
European Patent Office, "Extended European Search Report," dated Aug. 5, 2016, issued in European Patent Application No. 13 840 660.8, which is a European counterpart of U.S. Appl. No. 14/432,068 (8 pages).
International Search Report received for PCT Patent Application No. PCT/JP2013/076271 dated Jan. 7, 3014, with English Translation, 4 pages.
Room-Temperature Direct Bonding Using Fluorine Containing Plasma Activation, Chenxi Wang and Tadatomo SAGA, Journal of the Electrochemical Society, vol. 158, pp. H525-H529, Published Mar. 18, 2011 (5 pages).
Korean Intellectual Property Office, Notice of Submission of Opinion in Korean Patent Application No. 10-2015-7007585 which is a Korean counterpart of U.S. Appl. No. 14/432,068, dated Feb. 9, 2017 (9 pages of English Translation, 10 pages of Notice of Submission of Opinion).
Korean Intellectual Property Office, "Notice of Submission of Opinion," dated Aug. 24, 2016, issued in Korean Patent Application No. 10-2015-7007585, which is a Korean counterpart of U.S. Appl. No. 14/432,068, 13 pages (6 pages of English Translation and 7 pages of Notice of Submission of Opinion).

* cited by examiner

LOW TEMPERATURE (25-100°C) 1000-5000N PRESSURIZATION SEVERAL HOURS

FUNCTIONAL DEVICE AND METHOD OF MANUFACTURING THE SAME

This application is a National Stage entry under 35 U.S.C. 371 of International Patent Application No. PCT/JP2013/076271, filed on Sep. 27, 2013, which claims the benefit of and priority to Japanese Patent Application No. 2012-216267, filed on Sep. 28, 2012, the entire contents of each of which are incorporated by reference herein.

BACKGROUND OF THE INVENTION

Field of the Invention

The present invention relates to a functional device and a functional device manufacturing method.

Priority is claimed on Japanese Patent Application No. 2012-216267, filed on Sep. 28, 2012, the content of which is incorporated herein by reference.

Description of Related Art

In the related art, it is expected to use a micro scale fine space in the field of diagnosis and analysis or the like in order to realize a reduction in a mix and reaction time, a significant reduction in an amount of a sample and reagent, a reduction in the size of a device, and the like (for example, refer to PTL 1). For example, a micro-channel (a microflow path) including a groove having a depth less than or equal to a few hundred μm is formed on a glass substrate (a microchip) of a few square centimeters, and is bonded to the other substrate, and thus a liquid is able to flow through the micro-channel without leakage. In addition, a technology has been proposed and commercialized in which a functional material such as a biological substance or a catalyst, and an electrode is partially modified on an inner surface of the channel, and thus a desired function is imparted, and various chemical systems are integrated. As a substrate material configuring the micro-channel, a glass material having high strength, solvent resistance, and optical transparency for detection is desirable. However, as described later, in a case of glass, a high temperature (in a case of quartz glass, higher than or equal to 1000° C.) is required for bonding the substrates, and thus not only are the modified biological substance or catalyst, and electrode for imparting a function thermally damaged but also the entirety burns off. For this reason, as the one substrate of the related art, other substrates such as an elastomer which is easily bonded are used, and thus it is difficult to configure a channel only in the glass substrate.

In addition, recently, a nanoscale fine space exhibits unique physical properties of a solution compared to the microscale fine space, and thus a technology has attracted great attention in which a nano-channel (a nanoflow path, and an expansion nanoflow path) of a few dozen nm to a few hundred nm is formed on the glass substrate, an innovative functional device is realized by using unique chemical and physical properties of the nano-channel. For example, a protein or the like in one cell having a size of a few dozen m is analyzed by an expansion nano space which is a predominantly smaller space than the protein, and thus it is possible to analyze a function intrinsic to each cell which has not been found by an average of a plurality of cells so far, and it is expected to perform cancer diagnosis or the like by using one cancer cell which is initially generated. In addition, it is possible to perform measurement by one molecule using the fact that the nanoscale fine space is an extremely fine space which easily handles a few molecules, and thus it is expected to use the fine space as a super high sensitive analysis tool. Similar to the micro-channel, glass is preferable as a substrate material configuring the nanoscale fine space, but as described above, a bonding temperature is high, and thus it has been difficult to modify the biological substance or the catalyst, the electrode, and the like. In addition, a nanoscale channel is extremely small, and the channel can be easily closed due to deformation of a soft material, and thus it is not possible to use soft materials such as an elastomer which has been used for micro-channels.

Figure 10:
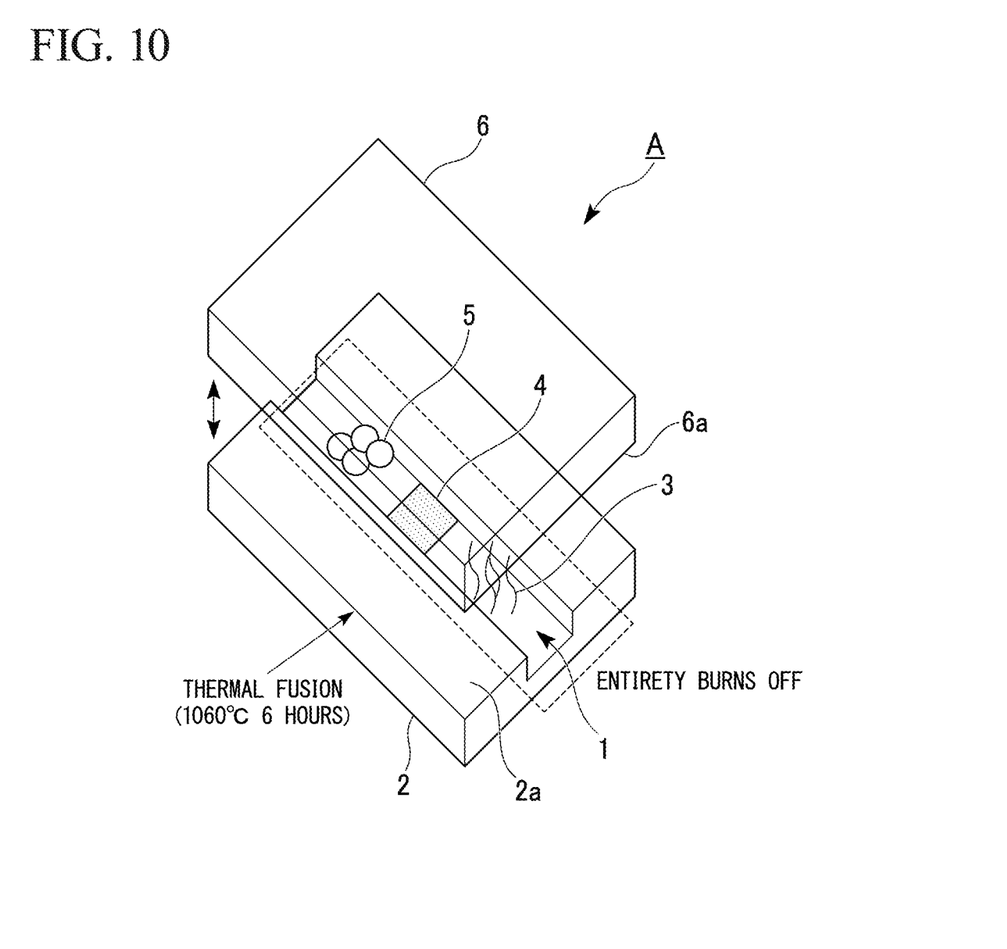
FIG. 10 is a perspective view illustrating a bonding step of a functional device manufacturing method of the related art.

As described above, when a functional device A including the microscale or nanoscale fine space (a fine flow path 1) is manufactured, as illustrated in FIG. 10, it is necessary that, for example, a capture body (an antibody, biological molecules, and the like) 3 for manipulating, capturing, or analyzing a target substance of a micro/nanoscale such as DNA or a biological sample, an electrode 4 and a catalyst 5 (a modification object) for electrically and chemically manipulating a target substance, and the like are patterned into a micro/nano-channel 1 formed on a glass substrate 2.

Then, the capture body 3 or the like is patterned onto an inner surface of the micro/nano-channel 1 formed on one glass substrate 2 by using photolithography, contact printing, an ink jet method, and the like, and the other glass substrate 6 is superposed on the one glass substrate 2, and thus the micro/nano-channel 1 is formed. After that, the functional device A including the micro/nano-channel 1 in which the capture body 3 or the like is patterned onto the inner surface is manufactured by being bonded. Accordingly, for example, when a sample solution including a target molecule of the target substance flows through the micro/nano-channel 1 of a closed flow path which is formed by bonding a pair of glass substrates 2 and 6, it is possible to capture the target molecule by the capture body 3, and thus it is expected that the target molecule is able to be analyzed by a single molecule using this functional device A.

CITATION LIST

Patent Literature

[PTL 1] Published Japanese Translation No. 2003-516129 of the PCT International Publication

SUMMARY OF THE INVENTION

However, as in the related art described above, in order to superpose and bond the pair of glass substrates 2 and 6, for example, it is necessary to heat the pair of glass substrates 2 and 6 at 1060° C. for 6 hours. For this reason, the capture body 3 or the like which is patterned onto a predetermined position of the inner surface of the micro/nano-channel 1 burns off, and thus a desired function cannot be obtained. In addition, in the related art, the capture body 3 or the like is partially patterned (modified) onto the predetermined position of the inner surface of the micro/nano-channel 1 after bonding the pair of glass substrates 2 and 6, but it is extremely difficult to accurately pattern partial modification after thermal fusion. In addition, the capture body 3 or the like is modified on upper, lower, right, and left wall surfaces of the micro-channel.

For this reason, in the fields of chemistry, biology, energy, and the like, in order to realize an innovative functional device using chemical and physical properties of a micro/nano-channel, there has been a strong demand for a method in which a functional device having high accuracy and high reliability is able to be manufactured by preferably patterning biological molecules or the like into the micro/nano-channel.

According to a first aspect of the present invention, a functional device includes a first substrate which has a groove formed on one surface of the first substrate; a second substrate which is integrally disposed with the first substrate by bonding one surface of the second substrate and the one surface of the first substrate, and forms a flow path together with the groove of the first substrate; and at least one modification object of a capture body which captures a target substance supplied into the flow path, an electrode which imparts an electrical or a chemical action to the target substance, and an catalyst, in which the modification object is disposed by being modified on a part of an inner surface of the flow path, a bonding portion between the one surfaces of the first substrate and the second substrate is formed by bonding fluorine to silica.

In the functional device according to the first aspect of the present invention, each of the first substrate and the second substrate may be a glass substrate or a silicon substrate.

In the functional device according to the first aspect of the present invention, at least one substrate of the first substrate and the second substrate may be a substrate including an $SiO_2$ layer on the one surface before being bonded.

In the functional device according to the first aspect of the present invention, the flow path may be a fine flow path of a microscale or a nanoscale.

In the functional device according to the first aspect of the present invention, the bonding portion may be formed on any one surface of the first substrate and the second substrate by supplying fluorine thereto.

In the functional device according to the first aspect of the present invention, it is preferable that a fluorine concentration of the bonding portion is greater than or equal to 0.6 at %.

In the functional device according to the first aspect of the present invention, it is preferable that a bonding strength of the bonding portion is greater than or equal to 0.5 J/m$^2$.

In the functional device according to the first aspect of the present invention, it is preferable that the bonding portion is formed to have pressure resistance performance in which a sample solution is not leaked even when a pressure of the sample solution including the target substance which is pressurized and supplied to the flow path is 2000 kPa.

In the functional device according to the first aspect of the present invention, it is preferable that at least any one of the one surface of the first substrate and the one surface of the second substrate before being bonded is formed to have hydrophilic properties in which a contact angle of water is from 10 degrees to 50 degrees.

In the functional device according to the first aspect of the present invention, the functional device may be formed by bonding the first substrate and the second substrate at 25° C. to 100° C.

In the functional device according to the first aspect of the present invention, the modification object may be a silane coupling agent.

According to a second aspect of the present invention, a method of manufacturing a functional device includes a flow path forming step of forming a groove on one surface of a first substrate; a patterning step of arranging at least one modification object of a capture body, an electrode, and a catalyst on at least one of the one surface of the first substrate and one surface of a second substrate, and cleaning a portion other than a modified portion; a contact angle controlling step of controlling a contact angle of water in a portion of the substrate to which the patterning step is not performed; and a substrate bonding step of bonding the one surfaces of the first substrate and the second substrate while maintaining a temperature at which at least one of the modified and arranged capture body, electrode, and catalyst is not thermally damaged.

In the method of manufacturing the functional device according to the second aspect of the present invention, each of the first substrate and the second substrate may be a glass substrate or a silicon substrate.

In the method of manufacturing the functional device according to the second aspect of the present invention, the flow path may be a fine flow path of a microscale or a nanoscale.

In the functional device manufacturing method according to the second aspect of the present invention, it is preferable that the contact angle is from 10 degrees to 50 degrees.

In the functional device manufacturing method according to the second aspect of the present invention, it is preferable that the temperature is 25° C. to 100° C.

In the functional device manufacturing method according to the second aspect of the present invention, the modification object may be a silane coupling agent.

In the functional device manufacturing method according to the second aspect of the present invention, a step of applying oxygen plasma and supplying fluorine to at least one of the one surface of the first substrate and the one surface of the second substrate as the contact angle controlling step may be further included.

In the functional device manufacturing method according to the second aspect of the present invention, as a cleaning step in the patterning step, vacuum ultraviolet light may be exposed through a photomask.

In the functional device manufacturing method according to the second aspect of the present invention, as a cleaning step in the patterning step, plasma may be exposed through a photomask.

In the functional device and the functional device manufacturing method described above, the flow path is formed, and the one surface of the one substrate on which at least one modification object of the capture body, the electrode, and the catalyst is disposed and the one surface of the other substrate are bonded by bonding fluorine to silica, and thus it is possible to manufacture the functional device by bonding the substrates while maintaining a temperature at which the modification object is not thermally damaged. For this reason, thermal damage as in the related art does not occur in the capture body, the electrode, and the catalyst (the modification object), and it is possible to comparatively easily and accurately pattern the capture body, the electrode, and the catalyst onto an arbitrary position of one inner surface forming the flow path.

DETAILED DESCRIPTION OF THE INVENTION

Hereinafter, a functional device and a functional device manufacturing method according to one embodiment of the present invention will be described with reference to FIG. 1 to FIG. 9.

Figure 1:
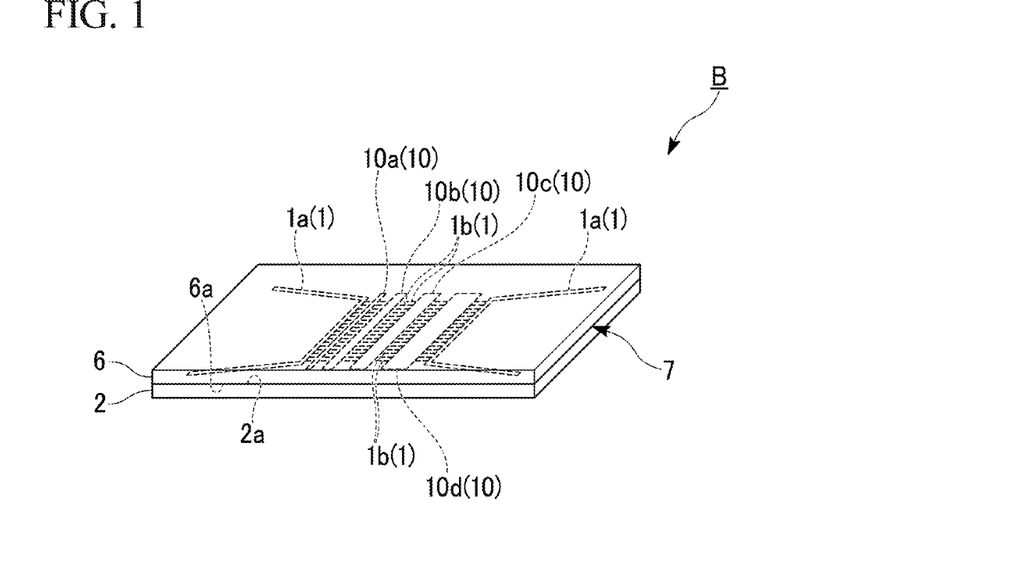
FIG. 1 is a perspective view illustrating a functional device according to one embodiment of the present invention.

As illustrated in FIG. 1, a functional device B of this embodiment is formed by superposing two glass substrates (one substrate (a first substrate) 2 and the other substrate (second substrate) 6) having the same shape and the same size of a few square centimeters. At this time, on one surface 2a of the one glass substrate 2, each micro-channel (a microflow path or a microscale fine flow path 1 (1a)) including a groove with a depth less than or equal to a few hundred μm is formed in both right and left side portions interposing a center portion therebetween. In addition, each of the micro-channels 1a in both the right and left portions is formed in the approximate shape of a U or an inverted U, and both ends thereof are arranged on side portions, and thus the micro-channels 1a are formed by being bilaterally symmetrically arranged about the center portion.

Further, on the one surface 2a of the one glass substrate 2, the right and left micro-channels 1a are communicated with the center portion, and a plurality of nano-channels (an expansion nanoflow path or a nanoscale fine flow path 1(1b)) which has a depth of a few dozen to a few hundred nm and linearly extends in a right and left direction is formed.

In addition, on one surface 6a of the other glass substrate 6, aminopropyl triethoxy silane (APTES: a silane coupling agent) 10 as a capture body (a modification object) is modified into the shape of a stripe and is disposed in a plurality of portions of the center portion. For example, a plurality of stripe-like APTES 10 having a width of 50 μm (10a), 100 μm (10b), 200 μm (10c), and 300 μm (10d) is arranged in parallel at predetermined intervals.

The functional device B of this embodiment is formed by bonding the one surfaces 2a and 6a of the one glass substrate 2 and the other glass substrate 6, and by including the micro-channel 1a and the nano-channel 1b communicated with each other in an inner portion. In addition, at this time, in the functional device B of this embodiment, on one inner surface of four inner surfaces of the nano-channel 1b which is formed in the center portion to have a rectangular cross-sectional surface, each of the plurality of APTES 10 is partially modified in a predetermined position at predetermined intervals. Further, each of the micro-channels 1a in both the right and left side portions is formed by opening an end portion to the outside.

Then, in the functional device B of this embodiment having the configuration described above, as illustrated in FIG. 2, for example, a sample solution S including DNA (a target substance 11) is injected into the inner portion of the micro-channel 1a from the end portion of the one micro-channel 1a. Then, when this sample solution S flows through the nano-channel 1b, the APTES 10 of the capture body is covalently bonded to the DNA 11 by a crosslinker, and thus the DNA 11 is selectively captured in the APTES 10 of the capture body. Accordingly, the DNA 11 is partially immobilized in a predetermined position on the inner surface of the nano-channel 1b of the functional device B.

Figure 2:
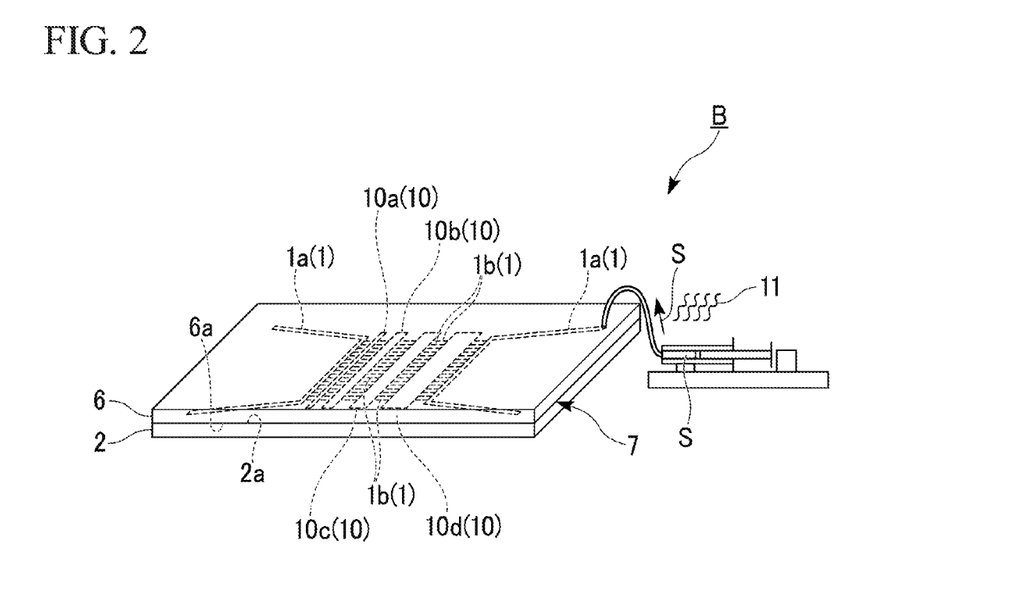
FIG. 2 is a diagram illustrating a state in which a sample solution flows through a fine flow path of a functional device according to one embodiment of the present invention, and a target substance is immobilized.

Here, according to the functional device B of this embodiment, as described above, it is possible to capture a protein in a cell within the nano-channel 1b by using the DNA 11, and thus it is possible to analyze a protein or the like expressed in a cancer cell at one cell level.

In addition, when the functional device B of this embodiment, for example, injects the sample solution S including biological molecules (the target substance 11), and patterns the biological molecules 11 onto the inner surface of the nano-channel 1b of a few dozen to a few hundred nm, it is possible to perform condensation or separation, quantitative analysis, or the like with respect to the analysis sample by using an interaction between the biological molecules 11. Further, by using an extremely small space volume of the nano-channel 1b of femto liter to atto liter, it is possible to perform analysis at a single molecule level, and for example, by integrating immune assay to the nano-channel 1b, it is possible to develop a trace amount of a sample such as a single cell into a highly sensitive quantitative analysis method. In addition, when such a space is used, the size of the space is controlled and a specific surface area is extremely high, and thus it is possible to perform a highly efficient separating manipulation by using chromatography.

Figure 3:
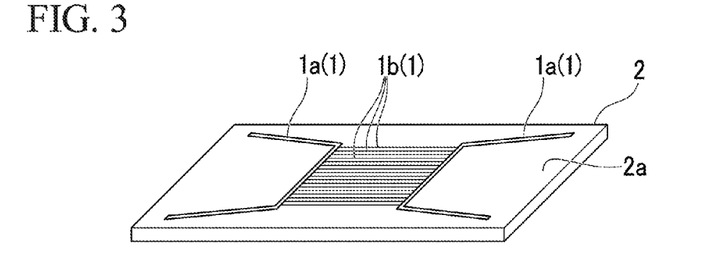
FIG. 3 is a perspective view illustrating one substrate in which a fine flow path is formed on one surface.

Next, a manufacturing method of the functional device B of this embodiment will be described. When the functional device B of this embodiment is manufactured, as illustrated in FIG. 3, the fine flow path 1 of the micro-channel 1a or the nano-channel 1b is formed on the one surface 2a of the one glass substrate (the first substrate) 2 by using suitable means such as laser processing or etching processing (a flow path forming step).

Figure 4:
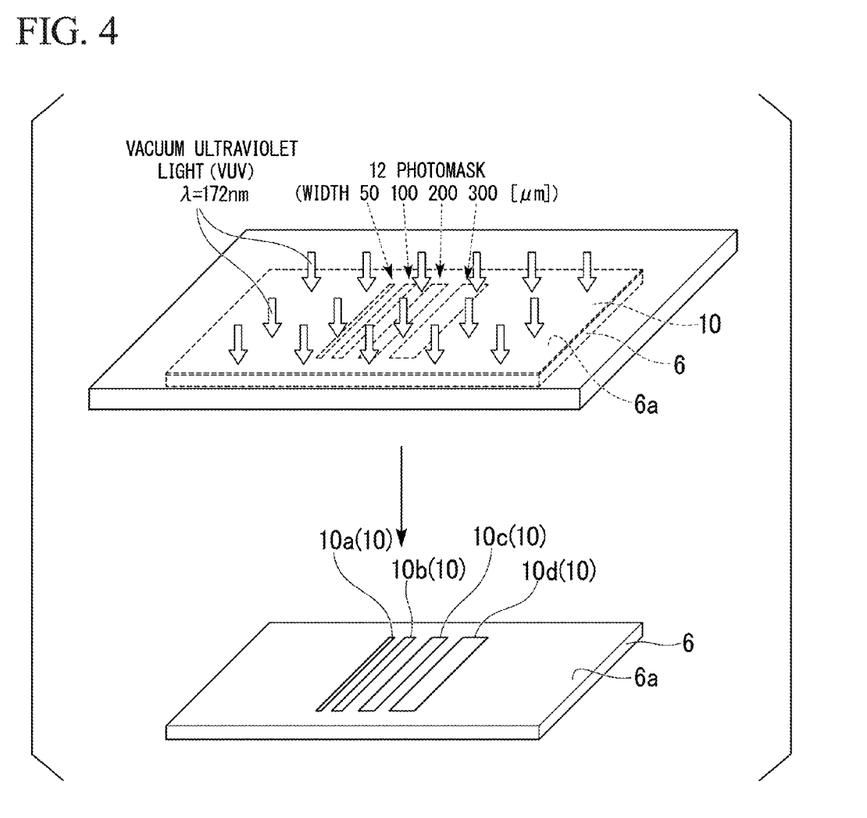
FIG. 4 is a perspective view illustrating a step of patterning a capture body onto one surface of the other substrate in a functional device manufacturing method according to one embodiment of the present invention.

In addition, as illustrated in FIG. 4, the APTES 10 (10a, 10b, 10c, and 10d) as an example of the capture body (the modification object) is modified and arranged on the one surface 6a of the other glass substrate (the second substrate) 6 (a patterning step). At this time, for example, the one surface 6a of the other glass substrate 6 is irradiated with vacuum ultraviolet light having a wavelength of 172 nm for approximately 10 minutes through a photomask 12 such that the APTES 10 is modified on the entire one surface 6a of the other glass substrate 6, and the APTES 10 of a plurality of stripes having a width of 50 μm, 100 μm, 200 μm, and 300

μm is formed at predetermined intervals as the capture. When the vacuum ultraviolet light is emitted, the APTES 10 is decomposed according to generated active oxygen.

Accordingly, the APTES 10 remains in a portion which is not irradiated with the vacuum ultraviolet light by the photomask 12, and the APTES (10a, 10b, 10c, and 10d) of a plurality of stripes having a width of 50 μm, 100 μm, 200 μm, and 300 μm is modified and formed at predetermined intervals on the one surface 6a of the other glass substrate 6. That is, a pattern of the APTES 10 as the capture body is formed. In addition, in this step, a surface of a portion on which the APTES 10 is not formed is cleaned by the vacuum ultraviolet light, and thus it is possible to provide a surface suitable for the subsequent bonding process.

Figure 6:
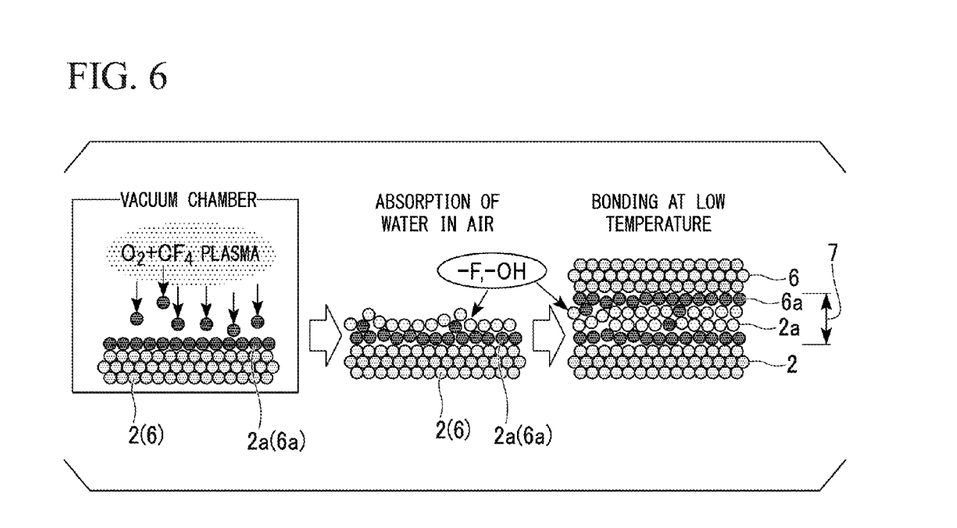
FIG. 6 is a diagram illustrating a step of bonding one surface of one substrate and one surface of the other substrate at a low temperature in a functional device manufacturing method according to one embodiment of the present invention.

Next, as illustrated in FIG. 6, the one surface 2a of the one glass substrate 2 is exposed to oxygen plasma ($O_2$ plasma) at an oxygen pressure of 60 Pa, at 250 W, and for 40 seconds, and the one surface 2a of the one glass substrate 2 is activated. In addition, fluorine (methane tetrafluoride: $CF_4$) is supplied at the same time as the oxygen plasma irradiation, and hydrophilic properties of the one surface 2a of the one glass substrate 2 are adjusted. Furthermore, an evaluation of the hydrophilic properties is performed by measuring a contact angle, and a fluorine treatment is performed such that a contact angle of water on the substrate 2 to which the patterning step is not performed is 10° to 50°. Furthermore, in this example, when the fluorine treatment is not performed, but the contact angle is able to be adjusted to 10° to 50°, any method may be used. For example, it is considered that a plasma treatment, a chemical treatment (acid or alkali), or the like is performed in a state where a modified portion is protected.

Furthermore, in this embodiment, any one surface 2a (6a) of the one glass substrate 2 (6) is activated, and the one surfaces 2a and 6a of both the one glass substrate 2 and the other glass substrate 6 may be activated in a state that the APTES 10 is protected by being covered with other substrates or the like.

Figure 5:
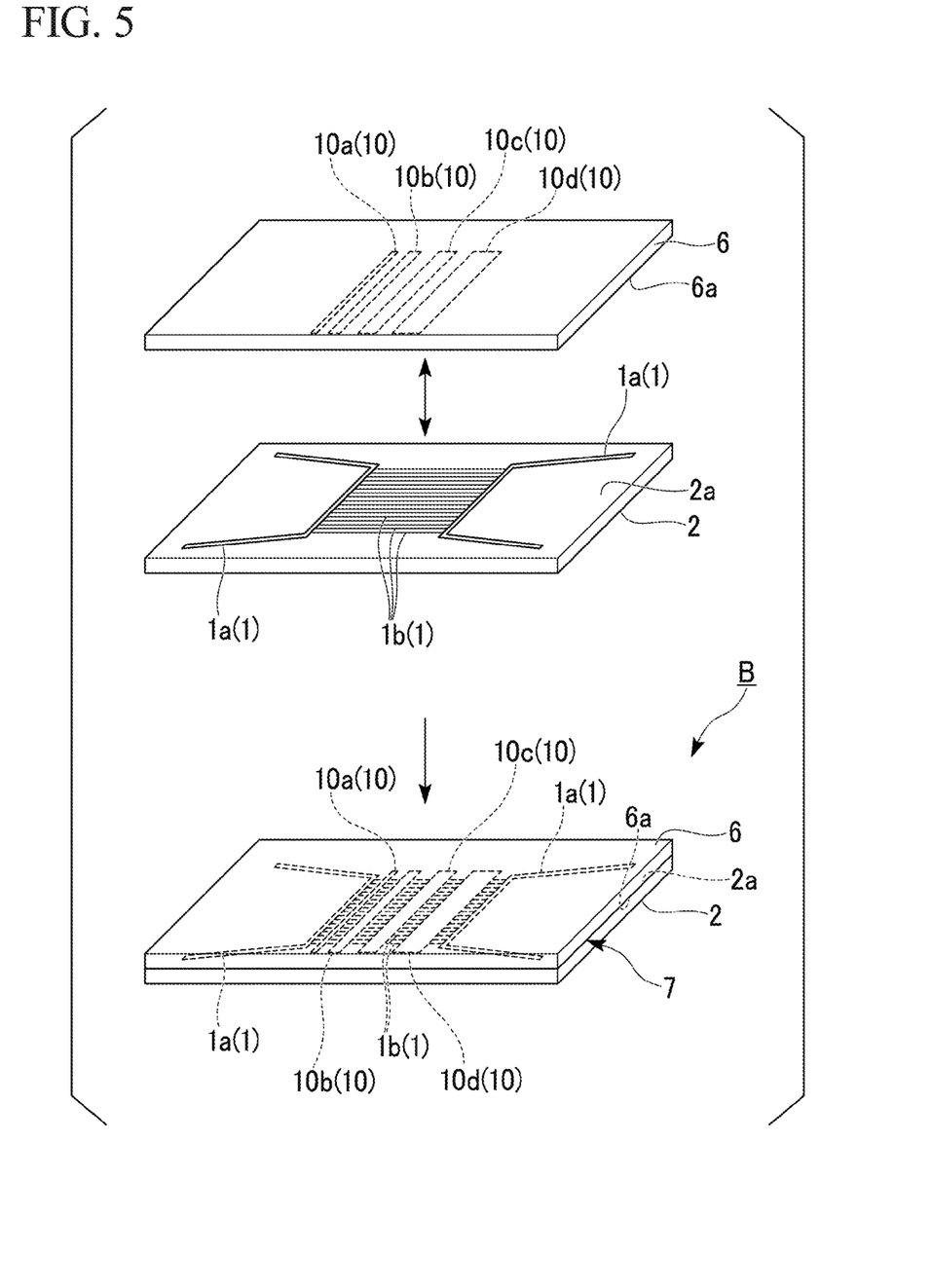
FIG. 5 is a perspective view illustrating a step of bonding one surface of one substrate and one surface of the other substrate by superposing the one substrate on the other substrate in a functional device manufacturing method according to one embodiment of the present invention.
Figure 7:
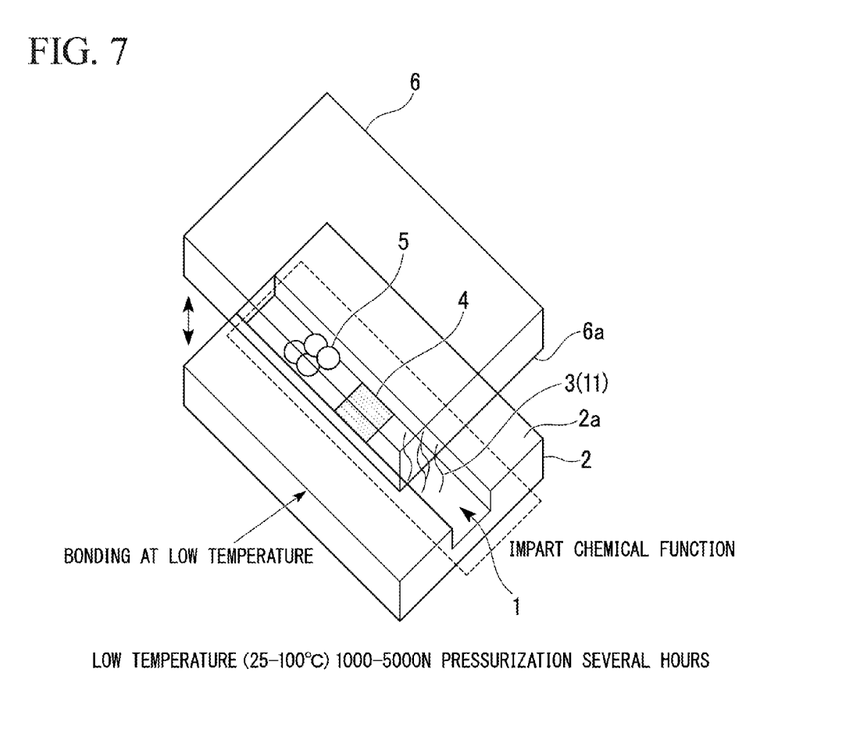
FIG. 7 is a perspective view illustrating a step of bonding one surface of one substrate and one surface of the other substrate by superposing the one substrate on the other substrate in a functional device manufacturing method according to one embodiment of the present invention.

Next, as illustrated in FIG. 5 and FIG. 7, the one surface 2a of the one glass substrate 2 and the one surface 6a of the other glass substrate 6 of which hydrophilic properties are adjusted by being activated are superposed in surface contact with each other. Then, in this embodiment, the one glass substrate 2 and the other glass substrate 6 are pressed by a force of 1000 N to 5000 N while being heated at a low temperature of approximately 25° C. to 100° C. at which the APTES 10 as the capture body is not thermally damaged, and are maintained for a few hours in this state. Then, the surface 2a of the one glass substrate 2 is activated, and thus as described above, a predetermined bonding strength is obtained even at a low temperature, and the one surfaces 2a and 6a of the one glass substrate 2 and the other glass substrate 6 are solidly bonded (a substrate bonding step).

Conditions at this time, a confirmation method of a pattern, and the like are collectively shown in Table 1. As shown in Table 1, according to a test in which the presence or absence of leakage of a sample solution is confirmed by setting a pressure of the sample solution supplied to the fine flow path 1 to 2000 kPa, it is confirmed that the functional device B of this example exhibits a sufficient pressure resistance performance without leakage even at a high pressure of 2000 kPa, and there is no practical problem in the modification object after bonding the substrates. Furthermore, when the fluorine treatment which is one aspect of this example is performed, it is confirmed that fluorine (F) exists on an interface (the bonding portion 7). In addition, the contact angle of water is not limited to 30° as described above, and when the contact angle is able to be controlled such that the contact angle is 10° to 500, a bonding strength shown in Table 1 is able to be greater than or equal to 0.5 $J/m^2$, and as a result thereof, it is possible to drive microfluid or nanofluid without leakage, and thus this method is able to be suitably used as a bonding method of substrates forming a microscale or nanoscale fine space.

TABLE 1

VARIOUS CONDITIONS AND EVALUATIONS IN THIS EXAMPLE

| SUBSTRATE 1 | | | | | BONDING CONDITIONS | | | EVALUATIONS | | | |
|---|---|---|---|---|---|---|---|---|---|---|---|
| SUBSTRATE | PLASMA | TEFLON (REGISTERED TRADEMARK) (POLYTETRAFLUOROETHYLENE) [mm] | CONTACT ANGLE [°] | SUBSTRATE 2 SUBSTRATE | PRESSURE [N] | TEMPERATURE [° C.] | TIME [h] | BONDING STRENGTH ACCORDING TO BLADE TEST [J/m²] | PRESENCE OR ABSENCE OF FLUORINE ATOM (PHOTOELECTRIC SPECTROSCOPY) | PRESSURE RESISTANCE PERFORMANCE (PRESSURE: 2000 kPa) | CONFIRMATION OF MODIFICATION OBJECT |
| QUARTZ GLASS | 250 M, 40 SECONDS | TWO OF 20 × 10 × 0.5 | 30 | QUARTZ GLASS IN WHICH APTES IS MODIFIED IN GAS PHASE AND IS IRRADIATED WITH VACUUM ULTRAVIOLET LIGHT FOR 10 TO 12 MINUTES, AND PATTERN IS FORMED | 5000 | 100 | 2 | 0.7 | Si—F BOND OBSERVED | NO LEAKAGE | AFTER MODIFY DNA, REACT DNA WITH FLUORESCENCE LABELED DNA HAVING COMPLEMENTARY SEQUENCE, AND CONFIRM BY USING FLUORESCENT MICROSCOPE |
| QUARTZ GLASS | 250 M, 40 SECONDS | TWO OF 20 × 10 × 0.5 | 30 | QUARTZ GLASS IN WHICH APTES IS MODIFIED IN GAS PHASE AND IS IRRADIATED WITH VACUUM ULTRAVIOLET LIGHT FOR 10 TO 12 MINUTES, AND PATTERN IS FORMED | 5000 | 100 | 2 | 0.7 | Si—F BOND OBSERVED | NO LEAKAGE | AFTER MODIFY ANTIBODY, REACT ANTIBODY WITH FLUORESCENCE LABELED ANTIGEN, AND CONFIRM BY USING FLUORESCENT MICROSCOPE |

In addition, in Table 1, a crack-opening method which is often used in the related art is adopted for an evaluation of the bonding strength of the substrate. Specifically, a laser blade is inserted between the bonded substrates, and the bonding strength is calculated from a length of the substrate which is peeled off. In order to identify a fluorine atom on the surface, a substrate surface which is peeled off after being bonded is measured by a photoelectric spectroscopy, and the bonding strength is confirmed from a peak strength of energy (687.1 eV) derived from an F—Si bond (a bond between fluorine and silica). A contact angle of the "substrate 1" is calculated by dropping water droplets onto the substrate after being subjected to a plasma treatment and a fluorine treatment, and by imaging a contact angle at a water/glass interface on the substrate surface by using a camera. DNA or an antibody (a protein) reacting with the APTES modified on the bonded substrate flows through modification object, and is modified on a portion on which the APTES exists. In order to confirm a modification pattern of the DNA, fluorescence labeled DNA having a complementary sequence to the modified DNA flows through the modified DNA, and thus it is confirmed that the fluorescence labeled DNA is fixed to a patterning portion due to hybridization by using a fluorescent microscope. A fluorescence labeled antigen flows through the antibody (the protein), and it is confirmed that the antibody is immobilized in the patterning portion due to an antigen and antibody reaction by using a fluorescent microscope.

Figure 8:
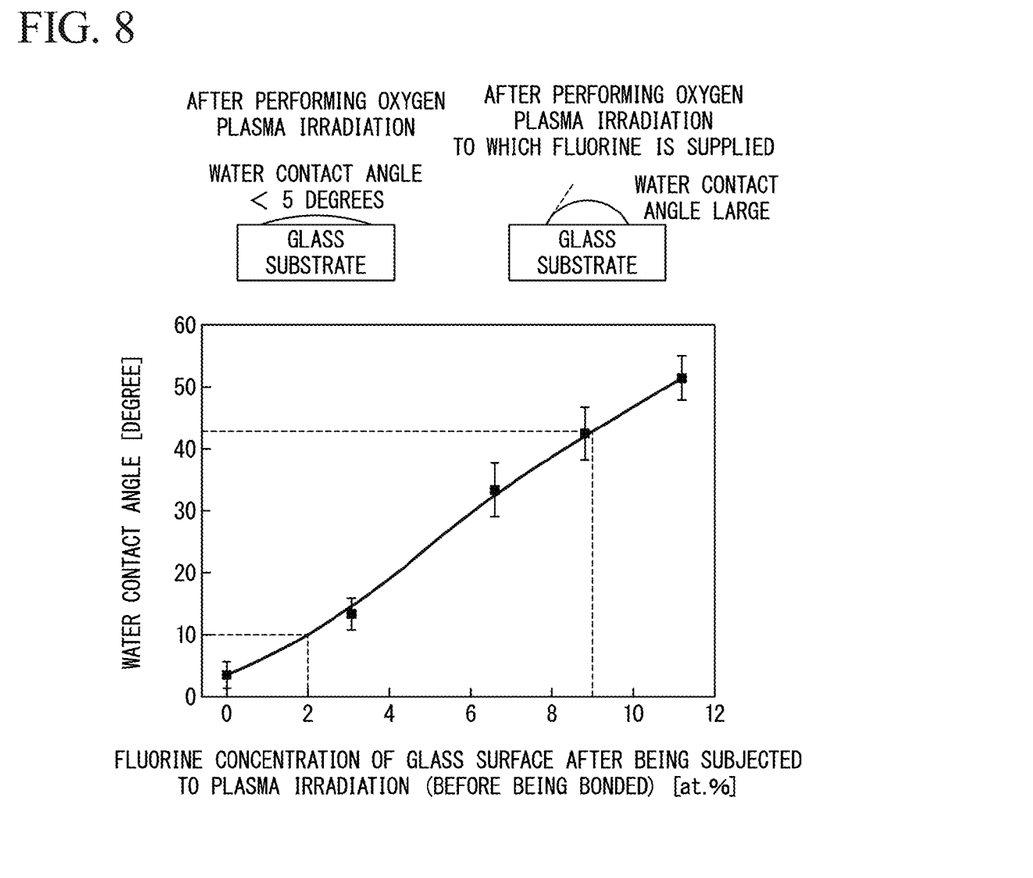
FIG. 8 is a diagram illustrating a relationship between a fluorine concentration and a contact angle of water after performing plasma irradiation with respect to one surface of a substrate before being bonded.

In addition, as illustrated in FIG. 8, it is confirmed that the contact angle of water on the one surfaces 2a and 6a of the substrates 2 and 6 is larger in a case of exposing to oxygen plasma with supplying fluorine than a case of exposing to oxygen plasma without supplying fluorine. Further, as illustrated in FIG. 8, a correlationship between a fluorine concentration (an atom concentration) and the contact angle of water of the one surfaces 2a and 6a of the substrates 2 and 6 after being subjected to the plasma irradiation, and as illustrated in FIG. 9, a correlationship between a fluorine concentration of the one surfaces 2a and 6a of the substrates 2 and 6 before being bonded and after being subjected to the plasma irradiation and a fluorine concentration of the bonding portion 7 (refer to FIG. 1, FIG. 2, and FIG. 6) after bonding the substrates 2 and 6 are confirmed, respectively.

Figure 9:
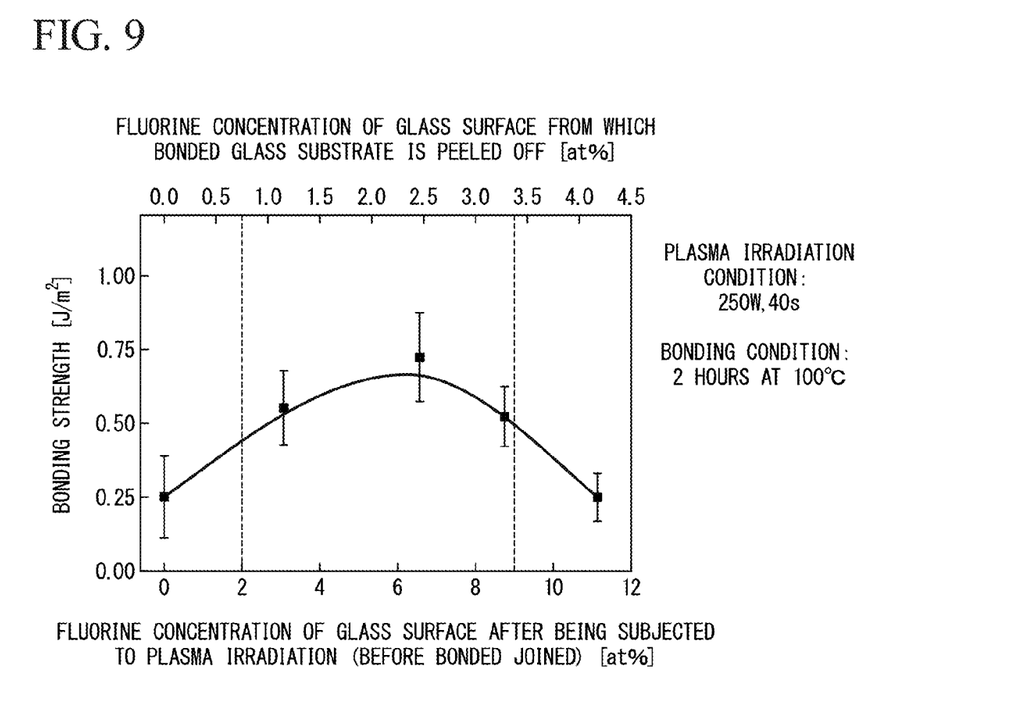
FIG. 9 is a diagram illustrating a relationship between a fluorine concentration after performing plasma irradiation with respect to one surface of a substrate before being bonded and a fluorine concentration of a bonding portion of the substrate after being bonded, and a relationship between a fluorine concentration of the one surface of the substrate before being bonded and the bonding portion of the substrate after being bonded, and a bonding strength of the substrate.

That is, as illustrated in test results of FIG. 8 and FIG. 9, it is confirmed that when the fluorine concentration of the one surfaces 2a and 6a of the substrates 2 and 6 before being bonded and after being subjected to the plasma irradiation is 2 at % to 9 at %, the fluorine concentration of the bonding portion 7 after bonding the substrates 2 and 6 is 0.6 at % to 3.5 at %. Then, it is confirmed that when the fluorine concentration of the one surfaces 2a and 6a of the substrates 2 and 6 before being bonded and the fluorine concentration of the bonding portion 7 of the substrates 2 and 6 after being bonded is in the concentration range described above, as shown in Table 1, the bonding strength between the one substrate 2 and the other substrate 6 is greater than or equal to 0.5 J/m$^2$, and thus a sufficient pressure resistance performance in which a leakage pressure is greater than or equal to 2000 kPa is able to be obtained.

Here, the fluorine concentration of the bonding portion 7 of the substrates 2 and 6 after being bonded indicates a value obtained by peeling off the substrates 2 and 6 after being bonded and by measuring the fluorine concentration of the surface.

Furthermore, in this embodiment, the glass substrates 2 and 6 are bonded by being heated at approximately 25° C. to 100° C., and by being maintained at a pressure of 1000 N to 5000 N for a few hours, but the glass substrates 2 and 6 may be bonded at a temperature at which the capture body 10 (3) (an electrode 4, and a catalyst 5), and the like are not thermally damaged, and it is not necessary that a heating temperature, a pressure, a time are not particularly limited to this embodiment. A temperature at which thermal damage occurs depends on a material, and for example, when a photocatalyst such as titanium oxide is used, a structure having a high catalytic function is maintained at a temperature less than or equal to 550° C.

Then, as described above, by bonding the one surfaces 2a and 6a of the pair of glass substrates 2 and 6, the functional device B is able to be formed in which the fine flow path 1 of the micro-channel 1a and the nano-channel 1b which are communicated with each other is included in the inner portion, and the APTES 10 as the capture body is partially modified and arranged in a desired position on the inner surface of the nano-channel 1b.

Therefore, in the functional device B of this embodiment and the manufacturing method of the functional device B, the microscale or nanoscale fine flow path 1 is formed, and the one surfaces 2a and 6a of the one glass substrate 2 and the other glass substrate 6 on which the capture body 10 is modified and arranged are bonded while maintaining a temperature at which the capture body 10 is not thermally damaged, and thus the functional device B is formed. For this reason, as in the related art, the capture body is not thermally damaged, and the capture body 10 is able to be partially, comparatively easily, and accurately patterned in an arbitrary portion on one inner surface forming the fine flow path 1. Accordingly, it is possible to obtain the high functional device B having high accuracy and high reliability.

In addition, each of the one substrate 2 and the other substrate 6 is a glass substrate, and thus it is possible to bond the one surfaces 2a and 6a at a low temperature of approximately 25° C. to 100° C. by using an activation treatment due to oxygen plasma, a hydrophilic treatment due to fluorine supplied thereto, and the like, and it is possible to form the functional device B by preventing thermal damage of the reliably capture body 10. In addition, the evaluation of the hydrophilic properties is performed by measuring the contact angle of water, and thus when the hydrophilic properties is controlled such that the contact angle of water on the substrate is 10° to 50°, it is possible to solidly and preferably bond the one surfaces 2a and 6a of the substrates 2 and 6.

Further, when the APTES 10 is modified on the one surface 6a of the other glass substrate 6, an unnecessary portion of the APTES 10 is decomposed and removed by being irradiated with the vacuum ultraviolet light, and the APTES 10 is used as the capture body, it is possible to perform patterning with high accuracy.

In addition, by using at least one glass substrate of the substrates 2 and 6 to be bonded, it is possible to observe the inside of the flow path 1 from the outside of the functional device B by using a fluorescent microscope or the like.

Further, by using a silane coupling agent as the modification object, it is possible to form a preferred capture body, and it is possible to more solidly bond the substrates 2 and 6.

As described above, one embodiment of the functional device and the functional device manufacturing method of the present invention is described, but the present invention is not limited to the one embodiment described above, and is able to be suitably changed within a range not deviating from the gist thereof.

For example, in this embodiment, it is described that both the one substrate 2 and the other substrate 6 are a glass substrate, but a silicon substrate may be used as any one of the substrate 2(6) or both the substrates 2 and 6. In this case, an $SiO_2$ layer exists on a surface of the silicon substrate, and thus, similar to this embodiment, it is possible to manufacture the functional device B by bonding the one surfaces 2a and 6a of the substrates 2 and 6 at a low temperature, and it is possible to obtain the same action and effect as that of this embodiment.

That is, the substrate according to the present invention may be a substrate having $SiO_2$ on a surface, and more preferably, may be a substrate having an $SiO_2$ layer on a surface, and by using such a substrate, it is possible to manufacture the same functional device B as that of this embodiment, and it is possible to obtain the same action and effect as that of this embodiment.

In addition, in this embodiment, it is described that the APTES 10 is modified on one inner surface of the fine flow path 1 as the capture body, but the capture body (the modification object) according to the present invention is not limited to the APTES 10. For example, spermidine or the like may be used as the capture body, and may be suitably selected according to the target substance 11 to be captured.

Further, in this embodiment, it is described that the capture bodies 10 and 3 are modified and arranged on one inner surface of the fine flow path 1, but the electrode 4 or the catalyst 5 (the modification object) which imparts an electrical or chemical action to the target substance 11 in the sample solution S flowing through the fine flow path 1 may be modified and arranged. Obviously, the functional device B may be configured by modifying and arranging the capture bodies 10 and 3, the electrode 4, and the catalyst 5 suitably independently or by modifying and arranging a plurality of combinations thereof.

Here, as it is known, the electrode 4, for example, expresses an action causing an oxidation-reduction reaction due to electron transfer, and as an example thereof, metal such as platinum, gold, chromium, and aluminum, and the like are included. Then, when the electrode 4 is modified and arranged, a method such as a sputtering method or a chemical vapor deposition method, a physical vapor deposition method, and a plating method is able to be applied.

In addition, the catalyst 5, for example, expresses an action improving a generation rate of a reactant by accelerating a chemical reaction rate, and as an example thereof, titanium oxide, palladium, iron, molybdenum, and the like are included. Then, when the catalyst 5 is modified and arranged, a method such as a sputtering method or a chemical vapor deposition method, a physical vapor deposition method, and attachment of catalyst particles is able to be applied.

In addition, in this embodiment, as a method of patterning the capture body 10 (the electrode 4, and the catalyst 5) on the one surface 6a of the other substrate 6, a method is exemplified in which one surface 6a of the other glass substrate 6 having the capture body of the APTES 10 modified on the entire surface is irradiated with vacuum ultraviolet light through the photomask 12, and the APTES 10 is decomposed by being irradiated with the vacuum ultraviolet light. On the other hand, in order to pattern the capture body 10, and the electrode 4 or the catalyst 5, for example, photolithography, contact printing, an ink jet method, and the like may be used, and obviously, it is not necessary that the method is limited to a method of a decomposing manipulation using a vacuum ultraviolet method. However, after the modification, a step of cleaning an area other than the modified portion is necessary. For this reason, it is also possible to protect the modified portion with other substrates or the like and to clean the modified portion by vacuum ultraviolet light, plasma irradiation, or the like. In addition, after protecting the modified portion with the catalyst, the electrode, or the like, it may be possible to perform a chemical treatment such as acid or alkali.

INDUSTRIAL APPLICABILITY

In the functional device and the functional device manufacturing method described above, the flow path is formed, and the one surfaces of the of the first substrate and the second substrate on which the modification object is modified and arranged are bonded while maintaining a temperature at which the modification object is not thermally damaged, and thus the functional device is formed. For this reason, the modification object is not thermally damaged as in the related art, and the modification object is able to be partially, comparatively easily, and accurately patterned in an arbitrary portion on one inner surface forming the flow path. Accordingly, it is possible to obtain the functional device having high accuracy and high reliability.

REFERENCE SIGNS LIST

1 Fine Flow Path
1a Micro-channel (Microflow Path, Groove)
11b Nano-channel (Nanoflow Path, Expansion Nanoflow Path, Groove)
2 One Glass Substrate (One Substrate, First Substrate)
2a One Surface
3 Capture Body (Modification Object)
4 Electrode (Modification Object)
5 Catalyst (Modification Object)
6 the Other Glass Substrate (the Other Substrate, Second Substrate)
6a One Surface
7 Bonding Portion
10 APTES (Capture Body (Modification Object))
11 Target Substance
12 Photomask
A Functional Device of the Related Art
B Functional Device
S Sample Solution

What is claimed is:
1. A functional device, comprising:
a first substrate which has a groove formed on one surface of the first substrate;
a second substrate which is integrally disposed with the first substrate by bonding one surface of the second substrate and the one surface of the first substrate, and forms a flow path together with the groove of the first substrate; and
one of a capture body which is configured to capture a target substance supplied into the flow path, an electrode which is configured to impart an electrical or a chemical action to the target substance, and a catalyst, in which the one is disposed on a part of an inner surface of the flow path, wherein
each of the first substrate and the second substrate is a glass substrate,
a bonding portion between the one surface of the first substrate and the one surface of the second substrate includes F—Si bonds where fluorine is bonded to silica included in at least one substrate, and said bonding portion between the one surface of the first substrate and the one surface of the second substrate has a fluorine concentration of greater than or equal to 0.6 at % and less than or equal to 3.5 at %.

2. The functional device according to claim 1, wherein the flow path is a fine flow path of a microscale or a nanoscale.

3. The functional device according to claim 1, wherein a bonding strength of the bonding portion is greater than or equal to 0.5 J/m$^2$.

4. The functional device according to claim 1, wherein the bonding portion is formed to have pressure resistance performance in which a sample solution is not leaked even when a pressure of the sample solution including the target substance which is pressurized and supplied to the flow path is 2000 kPa.

5. The functional device according to claim 1, wherein the capture body is formed of a silane coupling agent.

6. A method of manufacturing a functional device, comprising:
   forming a groove on one surface of a first substrate;
   arranging at least one of a capture body which is configured to capture a target substance supplied into the flow path, an electrode which is configured to impart an electrical or a chemical action to the target substance, and a catalyst in a position corresponding to an inner surface of the flow path which is formed of the groove and one surface of a second substrate at the time of bonding the first substrate and the second substrate;
   exposing oxygen plasma and supplying fluorine to at least one of the one surface of the first substrate and the one surface of the second substrate, and adjusting hydrophilic properties of the one surface; and
   a step of bonding the one surface of the first substrate and the one surface of the second substrate forming a bonding portion while maintaining a temperature at which the capture body, electrode or catalyst is not thermally damaged,
   the bonding portion between the one surface of the first substrate and the one surface of the second substrate including F—Si bonds where fluorine is bonded to silica included in at least one substrate, and
   the bonding portion between the one surface of the first substrate and the one surface of the second substrate having a fluorine concentration of greater than or equal to 0.6 at % and less than or equal to 3.5 at % wherein each of the first substrate and the second substrate is a glass substrate.

7. The method of manufacturing the functional device according to claim 6, wherein the flow path is a fine flow path of a microscale or a nanoscale.

8. The method of manufacturing the functional device according to claim 6, wherein a contact angle of water in at least any one of the one surface of the first substrate and the one surface of the second substrate before being joined is from 10 degrees to 50 degrees.

9. The method of manufacturing the functional device according to claim 6, wherein the temperature is 25° C. to 100° C.

10. The method of manufacturing the functional device according to claim 6, wherein the capture body is formed of a silane coupling agent.

11. A method of detecting a target substance by using the functional device according to claim 1, comprising:
   injecting a sample solution including a target substance into the flow path; and
   detecting a target substance captured in the flow path.

* * * * *